United States Patent [19]
Roschmann

[11] Patent Number: 5,160,890
[45] Date of Patent: Nov. 3, 1992

[54] MAGNETIC RESONANCE EXAMINATION APPARATUS USING A DIELECTRIC RESONATOR

[75] Inventor: Peter K. H. Roschmann, Hamburg, Fed. Rep. of Germany

[73] Assignee: U.S. Philips Corp., New York, N.Y.

[21] Appl. No.: 667,907

[22] Filed: Mar. 12, 1991

[30] Foreign Application Priority Data

Mar. 15, 1990 [DE] Fed. Rep. of Germany ....... 4008202

[51] Int. Cl.⁵ ............................................. G01R 33/20
[52] U.S. Cl. ..................................... 324/314; 324/318
[58] Field of Search ................ 324/314, 318, 322, 309, 324/307, 300, 316, 310, 311; 333/219.1; 128/653.2, 653.5

[56] References Cited

U.S. PATENT DOCUMENTS

| | | | |
|---|---|---|---|
| 4,631,480 | 12/1986 | Young | 324/309 |
| 4,633,180 | 12/1986 | Biehl et al. | 324/318 |
| 4,685,468 | 8/1987 | Macovski | 324/314 |
| 4,740,751 | 4/1988 | Misic et al. | 324/318 |
| 5,024,229 | 6/1991 | Bryant et al. | 324/318 |

FOREIGN PATENT DOCUMENTS 3410204 3/1985 Fed. Rep. of Germany.

OTHER PUBLICATIONS

Society of Magnetic Resonance in Medicine, Seventh Annual Meeting & Exhibition, Aug. 20-26, 1988, San Francisco, Calif., p. 267.

D. Kajfez et al., "Computed Modal Field Distributions for Isolated Dielectric Resonators", IEEE Transaction on Microwave Theory and Techniques, vol. MTT-32, No. 12, Dec. 1984, pp. 1609-1616.

Primary Examiner—Michael J. Tokar
Assistant Examiner—Raymond Y. Mah
Attorney, Agent, or Firm—Jack D. Slobod

[57] ABSTRACT

A dielectric resonator is used in a magnetic resonance examination apparatus comprising a magnet system (31, 32) for generating a steady magnetic field in an examination space (2), a transmitter device (12, 13, 18, 28) for generating an RF field to be superposed on the steady magnetic field in an object (30) to be examined, a device for producing a resonance step-up of the RF field active in the object (30) to be examined, and a device for detecting magnetic resonance signals generated in the object (30) to be examined. Stronger $B_1$ fields are created by at least one dielectric resonator (1, 5, 10, 16, 17, 20, 21) which neighbors the object (24) to be examined and which comprises a dielectric having a relative dielectric constant $\epsilon_r > 20$, the dimensions of the resonator being chosen so that therein, using a neighboring transmitter device, (12, 13, 18) there can be generated at least one resonant mode with a frequency which is in the vicinity of the Larmor frequencies to be detected of the nuclei to be excited in the object (24) to be examined, for example, protons.

23 Claims, 2 Drawing Sheets

MAGNETIC RESONANCE EXAMINATION APPARATUS USING A DIELECTRIC RESONATOR

FIELD OF THE INVENTION

The invention relates to a magnetic resonance examination apparatus, comprising a magnet system for generating a steady magnetic field in an examination space, a transmitter device for generating an RF field to be superposed on the steady magnetic field in an object to be examined, means for realizing a resonance step-up for the RF field active in the object to be examined, and a device for detecting magnetic resonance signals generated in the object to be examined.

BACKGROUND OF THE INVENTION

Apparatus of this kind are required notably for magnetic resonance tomography apparatus for medical diagnostics. In the essentially cylindrical central examination space of such apparatus a uniform, steady magnetic field ($B_0$ field) is generated on which gradient fields are superposed. The field lines of the $B_0$ field extend in the direction of the cylinder axis of the examination space which is referred to as the z-axis. The steady and/or pulsed gradient fields superposed on the $B_0$ field cause a deliberate gradient in the steady field distribution in at least one of the coordinate directions x,y,z.

In an object to be examined an RF field which is oriented perpendicularly to the $B_0$ field and which is as uniform as possible ($B_1$ field) must be generated with a frequency which corresponds to the Larmor (angular) frequency of the nuclei aligned in the $B_0$ field. The Larmor frequency of the precessional motion of the spin axis of the nuclei about the direction of the magnetic field is the product of a nucleus specific gyromagnetic factor and the magnetic field strength $B_0$. The gyromagnetic factor depends on the composition of the nucleus. For the protons of the hydrogen isotope $^1H$, for example for $B_0 = 4$ Tesla, a Larmor frequency of approximately 170 MHz is obtained. In magnetic resonance tomography for the examination of patients, notably the MR signals formed by $^1H$ protons due to the $B_1$ field are of importance, but the signals of other and different nuclei may also be evaluated for spectroscopic examinations.

An apparatus of the kind set forth is known, for example, from DE-OS 34 10 204. In RF coils and resonators used therein, involving conductor-bound RF currents, the maximum of the $B_1$ field occurs on the conductor surfaces, a substantially lower field strength existing in the useful space within a so called body coil in which an object to be examined is introduced. The stength of the $B_1$ field also decreases very quickly towards the interior of the object to be examined in the case of so called surface coils to be arranged on an object to be examined.

The signal-to-noise ratio becomes more favorable for the MR signals to be detected as the strength of the $B_1$ field generated in the object to be examined increases.

SUMMARY OF THE INVENTION

It is an object of the invention to construct an apparatus of the kind set forth so that, using simple means, stronger $B_1$ fields can be achieved within the object to be examined.

This object is achieved in that there is provided at least one dielectric resonator which neighbors the object to be examined and which consists of a dielectric having a relative dielectric constant $\epsilon_r > 20$, the dimensions of the resonator being chosen so that therein, using a neighboring transmitter device, at least one resonance mode can be generated with a frequency which is situated in the vicinity of the Larmor frequencies to be detected of the nuclei to be excited in the object to be examined, notably protons.

The invention offers the advantage that the signal-to-noise ratio upon detection of the MR signals is substantially enhanced and that substantially lower transmitter powers are required for excitation of the desired resonance fields.

Dielectric resonators are electrically non-conductive members whose dielectric constant $\epsilon_r$ is greater than that of the surrounding medium. Insulating materials having a particularly high dielectric constant are particularly suitably for the construction of such dielectric resonators. When excited by a magnetic RF field of suitable frequency, standing waves are produced in a dielectric resonator. Inside the dielectric resonator characteristic distributions of the magnetic and dielectric field strength occur, which distributions are referred to as modes. Within the dielectric resonator at least one zone of maximum magnetic field strength occurs, the electric field strength exhibiting a zero position in the relevant zone and hence a zero range which surrounds said zero position and in which the field strength is very low.

In modes of the lowest order (dominant modes) a single maximum zone of the magnetic field strength occurs in the center of the dielectric resonator, but higher-order modes can also be excited, the higher-order modes exhibiting, for example, two maximum zones of the magnetic field strength within the dielectric resonator. Details concerning the shape and the conditions for the occurrence of modes in dielectric members are described in the publication IEEE Transactions on Microwave Theory and Techniques, 1984, pp. 1609 to 1616, and in the references cited therein. Particularly suitable shapes for dielectric resonators are spherical, cylindrical or ellipsoidal configurations, so elementary, regular bodies.

Using a dielectric resonator in accordance with the invention, particularly high $B_1$ fields can be generated in an object to be examined, notably in parts of the body of a patient, the field strength of said fields being substantially higher, notably inside the object to be examined, than can be achieved by means of conventional, conductor bound resonators.

An embodiment of the invention is characterized in that in the dielectric resonator a central bore is provided in the zero zone of the electric field strength of the excitable resonant mode. In the bore for the introduction of an object to be examined the magnetic field strength remains substantially maximum in comparison with a dielectric resonator not provided with a bore. Because the electric field strength at the area of the bore exhibits a zero position and also very low values in the vicinity thereof, no substantial variation of the magnetic field distribution occurs despite the substantially decreased dielectric constant in the bore.

When the dielectric resonator is proportioned so that a resonant mode involving two zero zones of the electric field strength can be excited and when a bore for the introduction of objects to be examined is provided in each zero zone, two parts of the body can be simultaneously examined.

A particularly advantageous embodiment of the invention is characterized in that there are provided two similar dielectric resonators wherebetween a clearance (distance A) is created for the introduction of an object to be examined. The two electric resonators are coupled to one another relative to the resonance fields and a zone of maximum magnetic field strength is formed in the clearance therebetween. Thus, very strongly increased $B_1$ fields occur in an object to be examined which is introduced into that zone.

In the case of examination of objects which are liable to give rise to the formation of inner resonant modes because of their shape (see $7^{th}$ SMRM, 1988, page 267), it is possible to arrange the dielectric resonator in different relative positions adjacent an object to be examined. Because of the suitable relative position of the dielectric resonator, the zone of increased resonance of magnetic field strengths can be deliberately shifted within the object to be examined. Notably zones in which previously a minimum zone of the magnetic field strength was present can thus be exposed to a maximum field strength by shifting of the dielectric resonator. This embodiment of the invention also enables examination of voluminous objects to be examined.

Solid bodies having a high dielectric constant can be used for the dielectric resonator. Suitable ceramic materials are known but expensive. Blocks having dimensions in excess of 20 cm are almost impossible to manufacture.

Dielectric resonators can be particularly simply manufactured when the dielectric of the dielectric resonator consists of a liquid introduced into a container which predetermines the resonator shape. Because of its high constant ($r=80$ in water ($H_2O$)), water is particularly suitable in this respect. Furthermore, ethylene glycol could also be used. A dielectric resonator containing a liquid dielectric can be simply manufactured in an arbitrary shape and size. The bodies to be filled may consist of, for example, plexiglass. Because the wall thickness of the containers may be comparatively small, the effect on the resonant frequency is substantially negligibly small.

Liquid resonators containing $H_2O$ or ethylene glycol ($C_2H_6O_2$) could be problematic in that spin excitation outside the useful zone, i.e. in the resonator itself, is usually unavoidable. The resultant strong $^1H$ or $^{13}C$ signal is then superposed on the usually very small useful signal and may give rise to dynamics problems in the RF preamplifier. Furthermore, in the case of MR imaging the imaging zone must be adapted to the resonator size in order to avoid backfolding artefacts during image reconstruction. The smaller imaging zone required for the useful zone, involving a correspondingly higher resolution, therefore cannot be used.

When a ceramic material or heavy water ($D_2O$) is used, the undesirable MR signals from zones outside the useful zone are avoided. Heavy water has substantially the same dielectric properties as normal water, but the MR frequency is a factor 6.5 lower for the same strength of the main field, so that it does not disturb $^1H$ measurements.

When the dielectric resonator serves for proton decoupling in $^1H/^{13}C$ double resonant experiments, dielectric resonators containing the less expensive water filling can be readily used.

The MR signal strength can be approximately doubled in comparison with the use of a pure RF alternating field when the nuclear spin precession is excited by means of an RF rotary field. In order to utilize this effect also for a dielectric resonator, therefore, the dielectric resonator is proportioned so that therein two resonant modes can be excited with a phase shift of preferably approximately 90°, the magnetic fields thereof extending approximately perpendicularly to one another.

In the drawing

The invention will be described in detail hereinafter with reference to the accompanying drawing.

DESCRIPTION OF THE PREFERRED EMBODIMENTS

Figure 1:
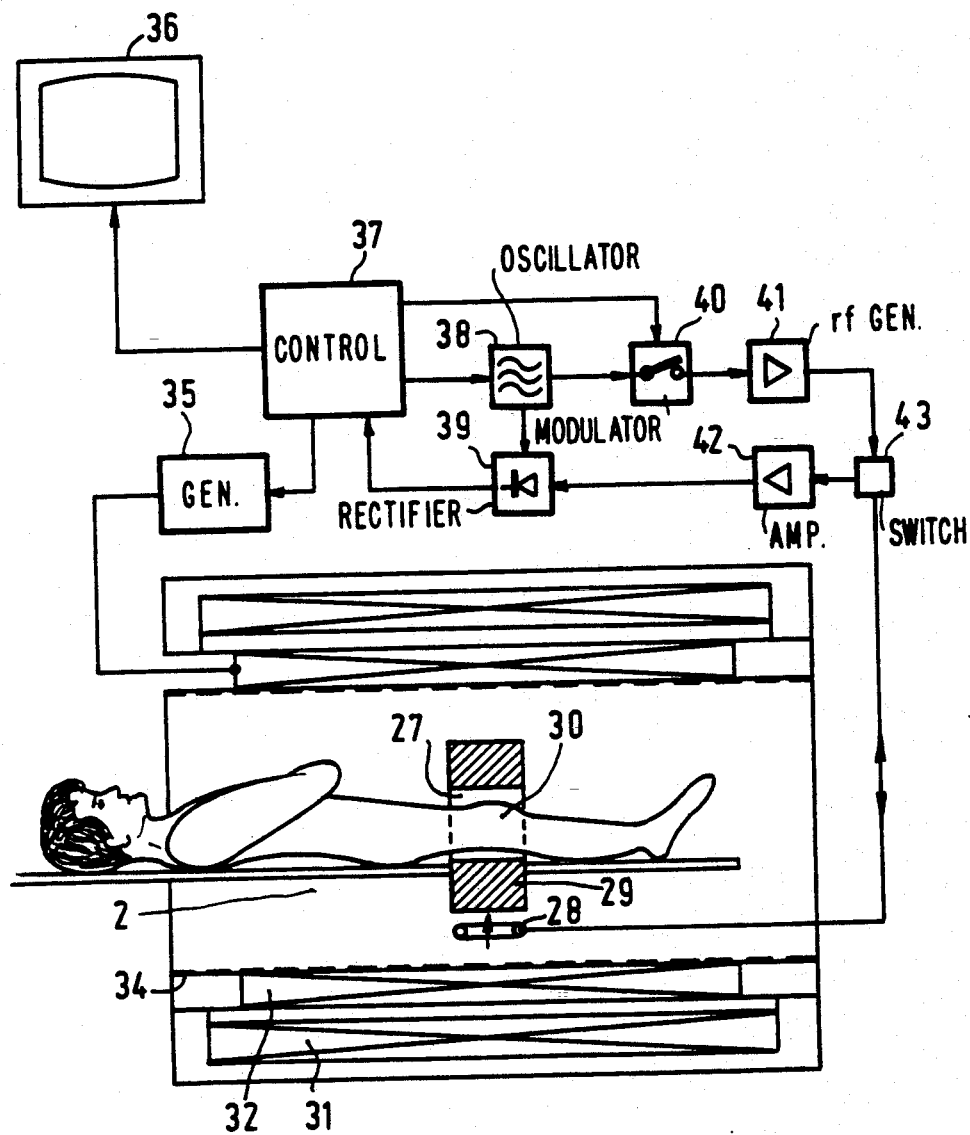
FIG. 1 shows the essential components of a magnetic resonance apparatus in accordance with an embodiment of the invention.

The magnetic resonance examination apparatus shown in FIG. 1 generates a steady magnetic field, using coils 31 and 32, in an examintion space 2 enclosed by a Faraday shield 34. The coils 31 generate a uniform field, and the coils 32 superpose a gradient field thereon.

In the object 30 to be examined, being a knee of a person introduced into the examination space 2 in the present example, there is also superposed an RF field which is excited in the cavity 27 of a dielectric resonator 29 by means of a transmitter device which is shown as a coil 28.

A central control device 37 controls the execution of an examination of the object to be examined, notably the supply of energy from a generator 35 to the gradient coils 32, and also the monitor 36 for display. An RF oscillator 38 controls on the one hand a modulator 40 for an RF generator 41 which conducts RF energy to the transmitter coil 28 via a switch 43, and on the other hand a phase-sensitive rectifier 39 which processes the measuring signals which are derived from the transmitter coil 28 via the switch 43 and a signal amplifier 42.

Figure 2:
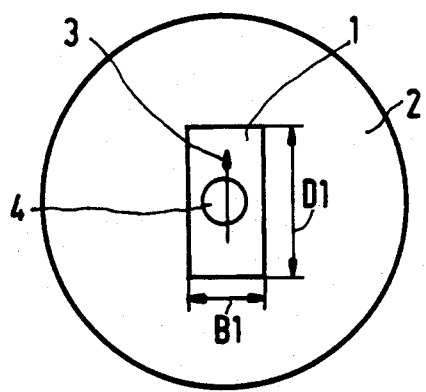
FIG. 2 shows a cylindrical dielectric resonator comprising a bore which extends orthogonally with respect to its cylinder axis.

FIG. 2 shows a cylindrical dielectric resonator 1, having a diameter D1 and a width B1, which is arranged in the examination space 2 of a magnetic resonance tomography apparatus. A steady magnetic $B_0$ field which is oriented perpendicularly to the plane of drawing, i.e. in the z-direction, exists in the examination space 2. The cylinder axis of the dielectric resonator extends perpendicularly to the z-direction. RF coils (not shown) generate an RF $B_1$ field (arrow 3) which extends perpendicular to the cylinder axis as well as perpendicular to the direction of the $B_0$ field. In the dielectric resonator 1 a magnetic field arises which extends in the direction of the excitation field and which has the form of a mode or standing wave whose maximum value occurs at the area of the bore 4 which extends in the z-direction. An object to be examined and introduced into the bore 4 is then present within a strong magnetic $B_1$ field for which only a very low transmitter power is required. The MR signals emanating from the relevant zone of the object after deactivation of the $B_1$ field can be received with a high signal-to-noise ratio.

Figure 3:
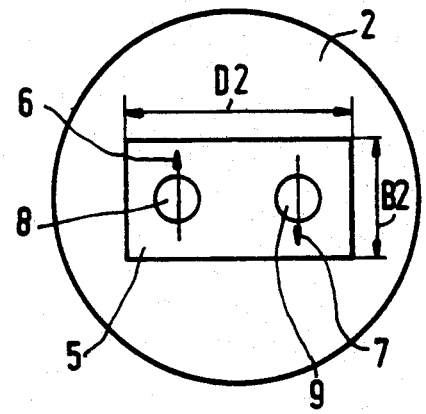
FIG. 3 shows a cylindrical dielectric resonator comprising two bores.

In FIG. 3 a cylindrical electrical resonator 5, having a diameter D2 and a width B2, is arranged in the examination space 2; in this resonator a higher-order mode can be excited, so that two maximum zones of the magnetic field strength arise in the directions and at the areas of the arrows 6 and 7. Two objects can be introduced and simultaneously examined in the bores 8 and 9 which extend in parallel in the z-direction.

Figure 4:
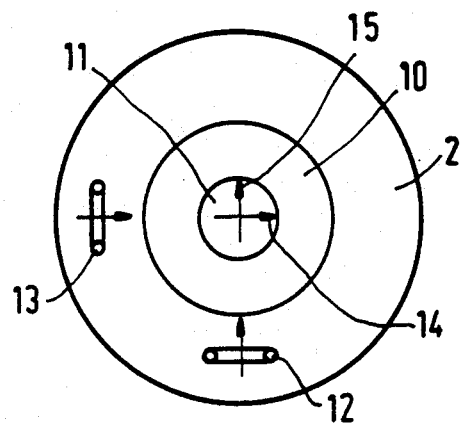
FIG. 4 shows a cylindrical dielectric resonator comprising a coaxial, bore and RF excitation coils offset in space.

In FIG. 4 the cylinder axis of the dielectric resonator 10 and its coaxial bore 11 extend in the z-direction. Using RF coils 12 and 13, which generate equal magnetic fields which have been phase-shifted 90° in time and which extend perpendicular to one another in space and also perpendicular to the z-direction, magnetic mode fields are generated in the directions 14 and 15, the mode fields producing a rotary field in an object introduced into the bore 11, the rotary field rotating in the same direcion as the spins of the nuclei to be excited.

Figure 5:
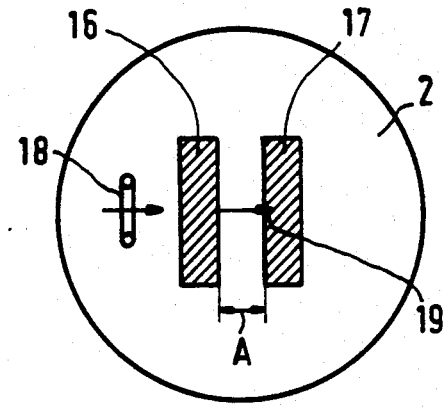
FIG. 5 shows two cylindrical dielectric resonators, coaxially arranged at a distance from one another, and a coaxial RF excitation coil.

In FIG. 5 similar cylindrical dielectric resonators 16 and 17 are arranged coaxially with respect to one another at a distance A from one another in the examination space 2. A clearance for introducing an object to be examined remains between the two resonators. The RF coil 18 generates magnetic resonance fields in the direction 19 in the dielectric resonators 16 and 17, which fields are superposed in the clearance between the resonators so as to form a zone in which there is a strong resonance step-up of the field strength.

Figure 6:
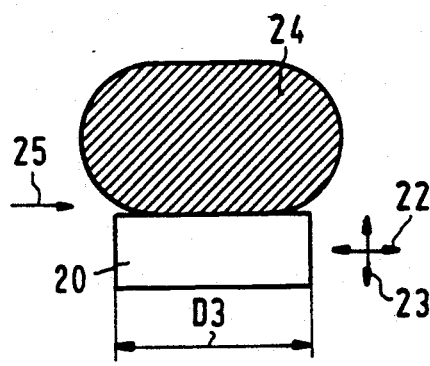
FIG. 6 shows a cylindrical dielectric resonator which is displaceable adjacent an object to be examined with a magnetic field direction extending perpendicularly to the cylinder axis.
Figure 7:
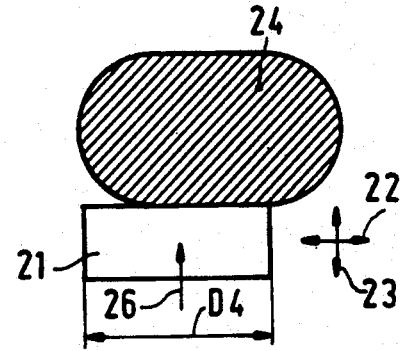
FIG. 7 shows a cylindrical dielectric resonator which is displaceable adjacent an object to be examined, the magnetic field direction extending axially parallel to the cylinder axis.

In the FIGS. 6 and 7 cylindrical dielectric resonators 20 and 21, having diameters D3 and D4, respectively, can be displaced, relative to an object 24 to be examined, in the direction of the double arrows 22 and 23. The devices shown in the FIGS. 6 and 7 differ as regards the direction 25, 26 of the magnetic field strength of the respective different modes excited. The devices shown in the FIGS. 6 and 7 are particularly attractive for examination of voluminous objects 24 which cannot be introduced into the bores of the FIGS. 2 to 4 or the clearance of FIG. 5.

The proportioning of dielectric resonators of the kind shown in the Figures can be calculated on the basis of known physical and mathematical laws. Sufficiently small dielectric resonator diameters (which must, of course, be smaller than the available inner diameter of the examination space of a magnetic resonance apparatus) are obtained when water is used as the dielectric for values of $B_0$ which exceed approximately 1.5 Tesla.

What is claimed is:

1. A magnetic resonance examination apparatus, comprising:
    a magnet system for generating a steady magnetic field in an examination space,
    a transmitter device for generating an RF field to be superposed on the steady magnetic field in an object to be examined,
    means for providing a resonance step-up for the RF field strength active in the object to be examined, and
    a device for detecting magnetic resonance signals generated in the object to be examined,
    said means for providing including at least one dielectric resonator which neighbors the object to be examined and which comprises a dielectric having a relative dielectric constant $\epsilon_r > 20$, the dimensions of the at least one dielectric resonator being chosen so that therein, using a neighboring transmitter device, at least one resonance mode can be excited with a frequency which is in the vicinity of the Larmor frequencies to be detected of the nuclei to be excited in the object to be examined.

2. An apparatus as claimed in claim 1 wherein the at least one dielectric resonator has a central bore in the zero zone of the electric field strength of the excitable resonant mode.

3. An apparatus as claimed in claim 1 wherein the at least one dielectric resonator is proportioned so that a resonant mode involving two zero zones of an electric field strength can be excited, and in that in the zero zones there is a respective bore for introducing objects to be examined.

4. An apparatus as claimed in claim 1 wherein said at least one dielectric resonator includes two similar dielectric resonators wherebetween a clearance is created for the introduction of an object to be examined.

5. An apparatus as claimed in claim 1 wherein the dielectric of the dielectric resonator comprises a liquid which is introduced into a container which predetermines the shape of the resonator.

6. An apparatus as claimed in claim 5 wherein the liquid is water ($H_2O$).

7. An apparatus as claimed in claim 6 wherein the liquid is heavy water ($D_2O$).

8. An apparatus as claimed in claim 1 wherein the at least one dielectric resonator is proportioned so that therein two resonant modes can be excited with a phase shift of preferably approximately 90°, the magnetic fields of the resonant modes extending approximately perpendicular to one another.

9. An apparatus as claimed in claim 2 wherein the dielectric of the at least one dielectric resonator comprises a liquid which is introduced into a container which predetermines the shape of the resonator.

10. An apparatus as claimed in claim 3 wherein the dielectric of the at least one dielectric resonator comprises a liquid which is introduced into a container which predetermines the shape of the resonator.

11. An apparatus as claimed in claim 4 wherein the dielectric of the at least one dielectric resonator comprises a liquid which is introduced into a container which predetermines the shape of the resonator.

12. An apparatus as claimed in claim 9 wherein the liquid is water ($H_2O$).

13. An apparatus as claimed in claim 10 wherein the liquid is water ($H_2O$).

14. An apparatus as claimed in claim 11 wherein the liquid is water ($H_2O$).

15. An apparatus as claimed in claim 9 wherein the liquid is heavy water ($D_2O$).

16. The apparatus of claim 1 wherein the nuclei are protons.

17. The apparatus of claim 7 wherein the nuclei are pistons.

18. The apparatus as claimed in claim 8 wherein the dielectric of the at least one dielectric resonator comprises a liquid which is introduced into a container which predetermines the shape of the resonator.

19. A dielectric resonator for use in a magnetic resonance examination apparatus including a magnet system for generating a steady magnetic field in an examination space, a transmitter device for generating an RF field to be superposed on the steady magnetic field in an object to be examined and a device for detecting magnetic resonance signals generated in the object to be examined, said dielectric resonator comprising:
 a housing for a dielectric material; and
 a dielectric material in said housing, said housing and dielectric material being constructed so as to be adjacent to said object to be examined, said dielectric material having a relative dielectric constant $\epsilon_r > 20$, the dimensions of said housing being chosen so that therein, using a neighboring transmitter of said apparatus, at least one resonance mode can be excited with a frequency which is in the vicinity of the Larmor frequencies to be detected of the nuclei to be excited in the object to be examined.

20. The resonator of claim 19 wherein the housing has a central bore for placement in the zero zone of the electric field strength of the excitable resonant mode.

21. The resonator of claim 19 wherein the housing is proportioned so that a resonant mode of the resonator involving two zero zones of the electric field strength can be excited, and in that in the zero zones there is a respective bore for introducing objects to be examined.

22. The resonator of claim 19 including two similar resonators wherebetween there is a space for receiving an object to be examined.

23. The resonator of claim 19 wherein the dielectric material is a liquid contained in said housing which predetermines the shape of the resonator.

* * * * *